(12) United States Patent
Mizojiri et al.

(10) Patent No.: US 12,218,270 B2
(45) Date of Patent: Feb. 4, 2025

(54) LIGHT SOURCE UNIT AND HEATING TREATMENT DEVICE

(71) Applicant: Ushio Denki Kabushiki Kaisha, Tokyo (JP)

(72) Inventors: Takafumi Mizojiri, Tokyo (JP); Keita Kanazu, Tokyo (JP); Takahiro Inoue, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 257 days.

(21) Appl. No.: 17/409,525

(22) Filed: Aug. 23, 2021

(65) Prior Publication Data

US 2022/0093820 A1    Mar. 24, 2022

(30) Foreign Application Priority Data

Sep. 23, 2020    (JP) .................................. 2020-158210

(51) Int. Cl.
*H01L 33/00* (2010.01)
*H01L 25/075* (2006.01)
*H01L 33/50* (2010.01)

(52) U.S. Cl.
CPC ...... *H01L 33/0095* (2013.01); *H01L 25/0753* (2013.01); *H01L 33/50* (2013.01)

(58) Field of Classification Search
CPC ............. H01L 33/08; H01L 27/15–156; H01L 25/075–0756
See application file for complete search history.

(56) References Cited

U.S. PATENT DOCUMENTS

| | | | |
|---|---|---|---|
| 2011/0260633 A1* | 10/2011 | Takeda ................... | H05B 45/39 315/192 |
| 2012/0061695 A1* | 3/2012 | Kim ...................... | H01L 33/641 257/E27.12 |
| 2013/0208026 A1* | 8/2013 | Suzuki ................ | H01L 25/0753 257/99 |
| 2014/0055996 A1* | 2/2014 | Shimozawa ........ | H01L 25/0753 362/235 |

(Continued)

FOREIGN PATENT DOCUMENTS

| | | |
|---|---|---|
| JP | 2013-8727 A | 1/2013 |
| JP | 2020-9927 A | 1/2020 |

OTHER PUBLICATIONS

Japanese Office Action of Oct. 20, 2023 for Japanese Application 2020-158210, which corresponds to the current U.S. Appl. No. 17/409,525, English Translation Enclosed.

*Primary Examiner* — Eliseo Ramos Feliciano
*Assistant Examiner* — Mikka Liu
(74) *Attorney, Agent, or Firm* — Yoshida & Associates LLC; Ken I Yoshida

(57) ABSTRACT

A light source unit of the present invention includes:
a board, and
a plurality of light source areas formed by a plurality of LED elements mounted on the board, wherein
each of the light source areas is provided with a plurality of LED element groups connected in parallel, each of the LED element groups being composed of a plurality of the LED elements connected in series, and
at least one of the light source areas is a single-wavelength light source area in which all of the LED elements emit light having substantially a same peak wavelength.

14 Claims, 4 Drawing Sheets

(56) References Cited

U.S. PATENT DOCUMENTS

| | | | |
|---|---|---|---|
| 2014/0241707 A1* | 8/2014 | Johnson | H01L 25/0753 |
| | | | 392/420 |
| 2015/0369661 A1* | 12/2015 | Lin | G06V 40/1318 |
| | | | 250/227.11 |
| 2020/0013645 A1 | 1/2020 | Gouda | |

* cited by examiner

LIGHT SOURCE UNIT AND HEATING TREATMENT DEVICE

TECHNICAL FIELD

The present invention relates to light source units and heating treatment devices, and more particularly relates to a light source unit and a heating treatment device having an Light Emitting Diode (LED) element as a light source.

BACKGROUND ART

Semiconductor manufacturing process involves various heating treatments including deposition treatment, oxidation diffusion treatment, modification treatment, and annealing treatment on substrates to be treated, such as semiconductor wafers. The following patent document 1 discloses an optical heating device that perform heating treatment on semiconductor wafers with light emitted from LED elements.

CITATION LIST

Patent Document

Patent Document 1: JP-A-2020-009927

SUMMARY OF INVENTION

Technical Problem

The equipment of irradiating semiconductor wafers with light in the semiconductor manufacturing process is expected to be capable of irradiating the entire surface of the semiconductor wafer (especially the main surface) with light having uniform intensity distribution to treat the entire semiconductor wafer uniformly.

The inventors of the present invention have diligently studied a heating treatment device that can irradiate the entire substrate to be treated, such as semiconductor wafers, with light more uniformly, and found the following issues.

An LED element has a very small luminance as a single component, compared with other light sources such as a halogen lamp and a discharge lamp. Hence, a heating treatment device that requires high output, such as heating treatment for semiconductor wafers, needs more than several thousands of LED elements.

Since the luminance of LED elements varies with the value of the current flowing through them, a heating treatment device having LED elements as a light source is configured to connect LED elements in series to achieve the value of the current flowing through each of the LED elements to be equal. However, in the heating treatment device, which uses more than several thousands of LED elements as described above, if all of the LED elements are connected in series, a very high voltage needs to be applied to both ends of the connections for lighting them.

Thus, as a light source installed in the heating treatment device, proposed has been the light source unit that is composed of a plurality of LED element groups that are connected in parallel, and each of the LED element groups being composed of several to dozens LED elements connected in series. The light source unit configured in this way has the same current flowing through the LED elements that are included in at least each of the LED element groups.

However, although the voltage applied to the both ends of each of the LED element groups connected in parallel is same, the current flowing through each of the LED element groups varies, if the forward voltage (Vf) of each of the LED elements constituting the LED element group is different.

Hence, the light source unit that is composed of a plurality of LED element groups that are connected in parallel, and each of the LED element groups being composed of LED elements connected in series, has unacceptably uneven luminance in the treatments that require high uniformity, such as the heating treatment of semiconductor wafers.

In view of the above problem, it is an object of the present invention to provide a light source unit and a heating treatment device using LED elements as its light source, the light source unit and the heating treatment device for improving the uniformity of light irradiated onto a substrate to be treated.

Solution to Problem

A light source unit of the present invention includes:
a board having a main surface, and
a plurality of light source areas formed by a plurality of LED elements mounted on the board, wherein
each of the light source areas is provided with a plurality of LED element groups connected in parallel, each of the LED element groups being composed of a plurality of the LED elements connected in series, and
at least one of the light source areas is a single-wavelength light source area in which all of the LED elements emit light having substantially a same peak wavelength.

In this specification, the term "LED elements having substantially the same peak wavelength" refers to LED elements having the difference between the longest peak wavelength and the shortest peak wavelength is 3% or less with respect to the shortest peak wavelength when the peak wavelength of each of the LED elements is compared.

LED devices emitting light with shorter wavelength, which is higher energy, have a characteristic of a higher forward voltage. For example, in the visible light wavelength band, LED devices emitting blue light have a higher forward voltage than those emitting red light.

Hence, the light source area that are constituted by LED elements emitting light having substantially the same peak wavelength, has a reduced variation in the forward voltage. In other words, the configuration described above allows the variation in the forward voltage of the LED elements at least in the single-wavelength light source area to reduce, compared with the other light source areas, thus suppressing the uneven luminance among each of the LED element groups.

In addition, an LED element emitting light having a shorter peak wavelength tends to form more defects inside the crystal thereof, thus resulting in the shorter operating life of the LED element. In other words, the variation in the peak wavelength causes the operating life of the LED element to vary. The configuration described above reduces the variation in the operating life of the LED elements and suppresses the uneven luminance of each of the LED element groups over a long period of time.

The light source unit described above may include a plurality of small boards disposed on the board, and each of the light source areas may be formed on a corresponding one of the small boards that are different with each other.

The above configuration enables the arrangement of the LED element groups to be easily replaced or modified for each small board mounted on the board. Hence, the above configuration enables the arrangement of the LED element groups, the wavelength band or intensity of the irradiated light, or the like, to be suitably adjusted according to the characteristics of the substrate to be treated including the type, shape, and size thereof.

In the above light source unit, each of the LED element groups included in the single-wavelength light source area may have the same number of the LED elements connected in series.

The above configuration allows the LED elements that constitute the single-wavelength light source area to become their forward voltage more aligned, thus suppressing the uneven luminance of each of the LED elements.

In the above light source unit, the single-wavelength light source area may be arranged in a circumferential direction of the board when viewed from a direction perpendicular to the main surface of the board.

The term "arranged in a circumferential direction" in this specification includes, for example, a case in which a plurality of small fan-shaped boards are combined and arranged to form a circular shape as a whole, or a case in which a light source area is formed to surround one or more light source areas.

The above configuration improves the uniformity of the light intensity distribution in the circumferential direction of the main surface of the substrate to be treated; in particular, the above configuration suppresses uneven irradiation to the substrate to be treated having a disk shape such as a semiconductor wafer in the circumferential direction, thus achieving light irradiation to the substrate to be treated more uniformly.

In the above light source unit, all of the LED elements mounted on the board may emit light having substantially the same peak wavelength.

The above configuration allows all of the LED elements mounted on the board to emit light having substantially the same peak wavelength, thus further improving the uniformity of the light irradiated to the substrate to be treated.

In the above light source unit, the LED elements included in the single-wavelength light source area may emit light having a peak wavelength of 300 nm or more and 1000 nm or less.

In particular, semiconductor wafers made of silicon (Si) (hereinafter referred to silicon wafers) have a high absorptance and a low transmittance for light having a wavelength band from ultraviolet to visible light; however, the absorptance rapidly decreases and the transmittance increases as the wavelength becomes longer than 1100 nm. As shown in FIGS. 4A to 4C, which will be referred to in the "DESCRIPTION OF EMBODIMENTS", approximately 50% of the irradiated light to the semiconductor wafer having a wavelength of 1100 nm or more transmits the semiconductor wafer.

In the case of the silicon wafer, when light having a wavelength of 1100 nm or more irradiates the surface opposite to the main surface to be treated, a part of the light transmits the silicon wafer and reaches the main surface to be treated. The transmitted light is absorbed on the main surface including the wiring formed thereon, causing variations in temperature distribution and possibly warping or cracking of the silicon wafer. In the case of deposition heating, many deposition types have a tendency of exhibiting a large variation in the absorptance at a wavelength of 1000 nm or more.

For this reason, the light emitted from the LED elements preferably has a peak wavelength of 1000 nm or less, in which the absorptance is 50% or more and the transmittance is 20% or less.

In addition, the absorptance of the silicon wafer decreases approximately to 10% at its lowest point for light having a wavelength of less than 300 nm. Hence, it is preferable that the light emitted from the LED elements have a peak wavelength of 300 nm or more in order to ensure an absorptance of at least 25% or more.

The above configuration allows the light source unit to perform heating treatment of silicon wafers more efficiently. In addition, variation in transmittance and reflectance for light having a wavelength of 300 nm or more and 1000 nm or less is smaller than those for resistivity variation that is caused by the amount of ion doping onto the silicon wafer. Hence, the light source unit is capable of heating the wafer uniformly on the entire surface thereof and at a constant heating rate regardless of the amount of ion doping.

Moreover, as shown in FIGS. 4A to 4C, the silicon wafer has an absorptance of 20% or more and a transmittance of nearly 0% for light having a wavelength of 300 nm or more and 1000 nm or less. For this reason the light in this wavelength range is capable of efficiently performing heating treatment only on the outermost surface of the silicon wafer.

In the above light source unit, the LED elements included in the single-wavelength light source area may emit light having a peak wavelength of 300 nm or more and 500 nm or less.

The heating treatment device that is used for, for example, heating treatment of substrate to be treated may be provided with a radiation thermometer to measure the surface temperature of the substrate to be treated in order to verify the uniformity of the temperature during the treatment. The radiation thermometer is a thermometer that measures the surface temperature of a measurement target by detecting the light emitted from the measurement target.

The radiation thermometer has a sensitivity wavelength band of mainly near-infrared to infrared wavelengths (e.g., 0.8 μm to 14 μm), although the sensitivity wavelength band varies slightly depending on the measurement target and temperature range. Hence, when the light source unit emits infrared light and the heating treatment device in which the light source unit is mounted is provided with the radiation thermometer, the radiation thermometer detects the light emitted from the light source unit as stray light.

Therefore, the configuration described above reduces the risk that the light emitted from the LED elements is detected by the radiation thermometer as stray light even if the sensitivity wavelength band of the radiation thermometer is around 0.8 μm.

In the above light source unit, the LED elements included in the single-wavelength light source area may emit light having a peak wavelength of 800 nm or more and 900 nm or less.

As shown in FIGS. 4A to 4C, the silicon wafer has a small variation in absorptance for light having a wavelength range of 800 nm or more and 900 nm or less. For this reason, uneven heating is unlikely to occur when light having this wavelength range is irradiated to the silicon wafer although the wavelength of the irradiated light differs in each irradiation area of the silicon wafer.

Therefore, the above configuration is capable of providing the light source unit that a variation in the peak wavelength of light emitted from the LED elements influences less on the silicon wafer.

A heating treatment device of the present invention is a heating treatment device for heating a substrate to be treated, the heating treatment device includes:

a chamber for accommodating the substrate to be treated, a supporter for supporting the substrate to be treated in the chamber, and the light source unit for irradiating light toward the substrate to be treated.

Advantageous Effects of Invention

The present invention provides a light source unit and a heating treatment device using LED elements as its light source, the light source and the heating treatment device for improving the uniformity of light irradiated onto a substrate to be treated.

DESCRIPTION OF EMBODIMENTS

Hereinafter, embodiments of a light source unit and a heating treatment device in accordance with the present invention will now be described with reference to the drawings. It is noted that each of the following drawings related to the light source unit and the heating treatment device is merely schematically illustrated. The dimensional ratios and the number of parts on the drawings do not necessarily match the actual dimensional ratios and the actual number of parts.

First Embodiment

Figure 1:
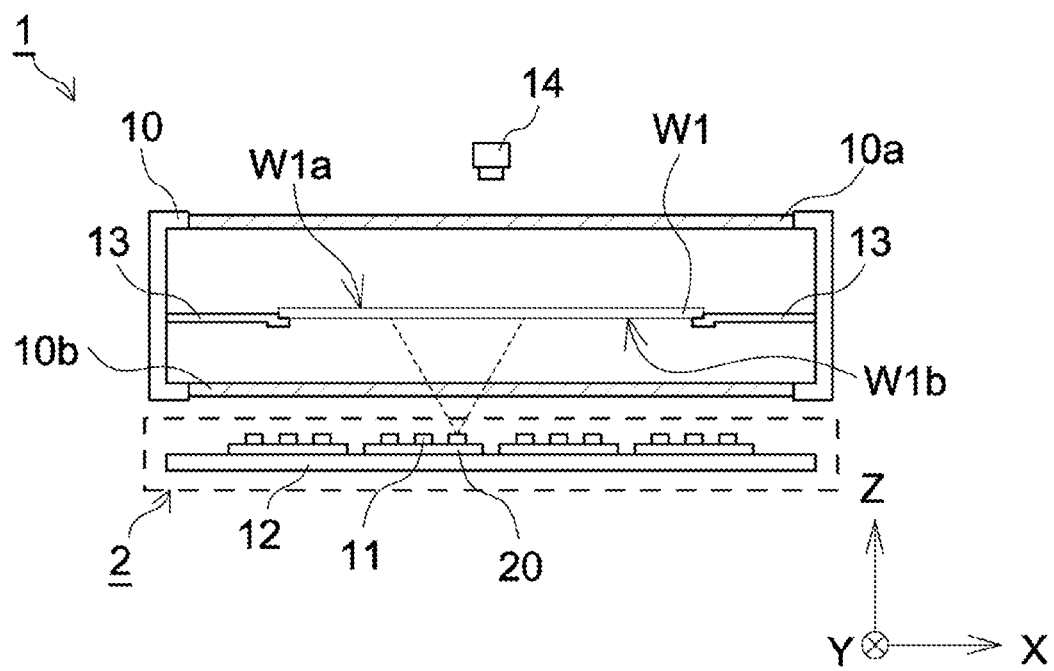
FIG. 1 is a schematic cross-sectional view illustrating a configuration of an embodiment of a heating treatment device, viewed in the Y direction.

FIG. 1 is a schematic cross-sectional view illustrating a configuration of an embodiment of a heating treatment device 1, viewed from the Y direction. As shown in FIG. 1, the heating treatment device 1 of the first embodiment is provided with a chamber 10 in which a substrate to be treated W1 is accommodated, a light source unit 2, and a radiation thermometer 14. The light source unit 2 is provided with a plurality of LED elements 11 and a board 12 on which the LED elements 11 are mounted. In the first embodiment, the substrate to be treated W1 is considered to be a silicon wafer; however, the substrate to be treated W1 may include a semiconductor wafer made of materials other than silicon, or a glass substrate.

Figure 2:
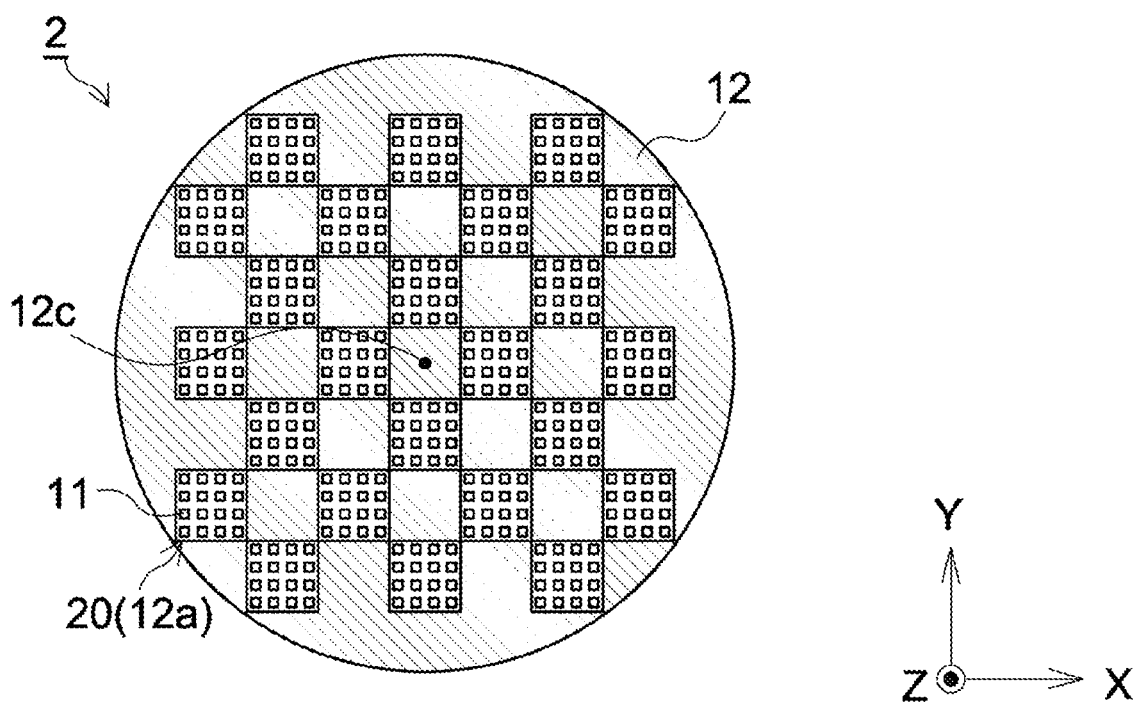
FIG. 2 is a schematic view of a light source unit in FIG. 1, viewed from the +Z side.

Hereinafter, as shown in FIG. 1, the Z direction is defined as a direction in which the board 12 and the substrate to be treated W1 face each other, the X direction as a direction in which a pair of supporters 13 face each other, and the Y direction as a direction orthogonal to the X and Z directions. In addition, since the arrangement of the LED elements that is viewed in the X and Y directions has the same structure, as shown in FIG. 2 described later, the structure of the heating treatment device 1 is described as a view from the Y direction, unless otherwise necessary.

Moreover, in the case of describing a direction to distinguish a positive direction from a negative direction, a positive or negative sign is added to the direction, such as "+Z direction" or "−Z direction". In the case of describing a direction without distinguishing a positive direction from a negative direction, the direction is simply expressed as "Z direction".

As shown in FIG. 1, a chamber 10 is provided with a supporter 13 that supports the substrate to be treated W1 inside. The supporter 13 supports the substrate to be treated W1 so as to place the main surface (W1a) of the substrate to be treated W1 on the XY plane.

The supporter 13 can be any configuration as long as the main surface (W1a) of the substrate to be treated W1 is placed on the XY plane; for example, the supporter 13 may include a plurality of pin-shaped protrusions at their points of which the substrate to be treated W1 is supported. Here, the main surface W1b refers to a surface to which light emitted from the LED elements 11 is irradiated.

The chamber 10 is also provided with a monitoring window 10a that faces the main surface W1a of the substrate to be treated W1 supported by the supporter 13, and a light transmissive window 10b that faces the main surface W1b of the substrate to be treated W1. The monitoring window 10a is provided to allow the radiation thermometer 14 to measure the temperature of the main surface W1a of the substrate to be treated W1. The light transmissive window 10b is provided to allow the light emitted from the LED elements 11 in the light source unit 2 and traveling toward the main surface W1b of the substrate to be treated W1 to enter the chamber 10.

The radiation thermometer 14 is a thermometer that measures the surface temperature of a measurement target by detecting the light emitted from the measurement target, and has a sensitivity wavelength band of approximately 0.8 µm or more and 14 µm or less.

FIG. 2 is a schematic view of a light source unit 2 in FIG. 1, viewed from the +Z side. As shown in FIG. 2, the light source unit 2 has a plurality of light source areas 12a including a plurality of LED elements 11 arranged on the main surface of the board 12. In the first embodiment, the light source areas 12a each are formed on a small board 20, which will be described later, and as shown in FIG. 1, the small board 20 on which the light source area 12a is formed is disposed on the board 12.

The light source unit 2 is disposed on the −Z side of the chamber 10 to allow its light to emit toward the main surface W1b of the substrate to be treated W1 supported by the supporter 13 through the light transmissive window 10b of the chamber 10, as shown in FIG. 1.

Figure 3:
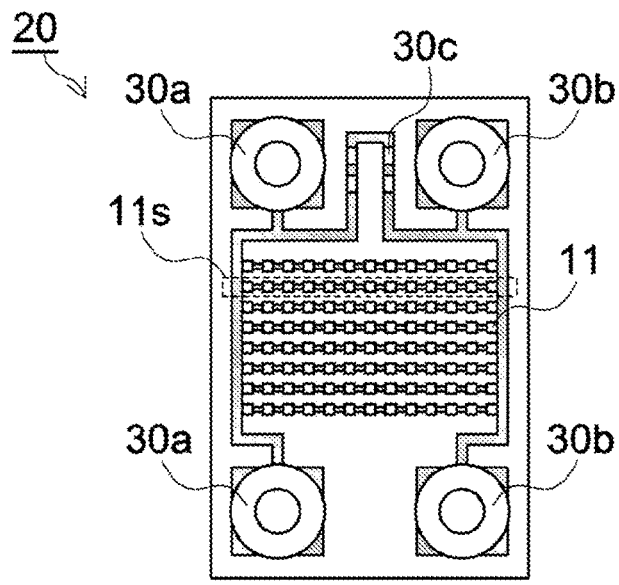
FIG. 3 is a schematic view illustrating a configuration of a small board.

FIG. 3 is a schematic view illustrating a configuration of the small board 20. As shown in FIG. 3, the small board 20 is provided with two anode electrodes 30a and two cathode electrodes 30b, to which electric power is supplied. A plurality of LED elements 11 are connected between the electrodes (30a, 30b) through wiring patterns. Also, Zener diodes 30c are connected between the electrodes (30a, 30b) in parallel with a plurality of the LED elements 11. The Zener diodes 30c are disposed to prevent the LED elements 11 from being damaged by static electricity or surge current.

The LED elements 11 are connected in series to form an LED element group 11s. A plurality of the LED element groups 11s, each being composed of the same number of the LED elements 11, are connected in parallel between the electrodes (30a, 30b).

The small board 20 is composed of a plurality of single-wavelength light source areas in which the LED elements 11 emitting light only having substantially the same peak wavelength are arranged. In the first embodiment, the small board 20 is composed of the LED elements 11 emitting light only having a peak wavelength of 395 nm.

The above configuration allows the LED elements 11 arranged on each small board 20 to have nearly the same forward voltage applied to them, resulting in suppressing uneven luminance of each of the LED elements 11, thus further improving the uniformity of light irradiated to the substrate to be treated W1.

Figure 4A:
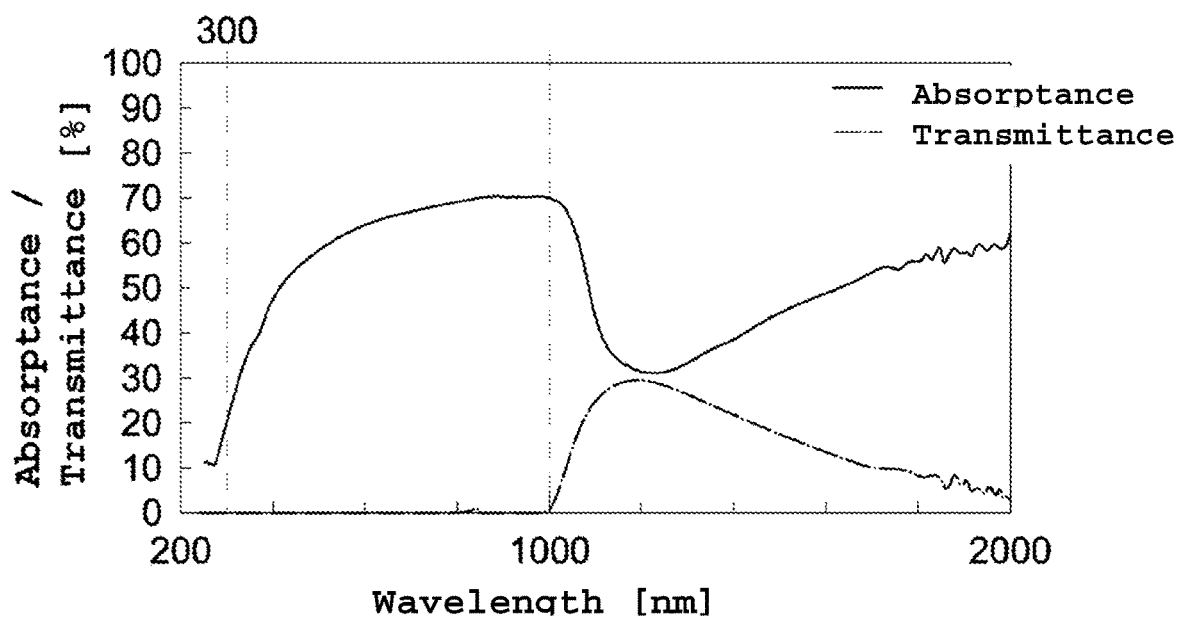
FIG. 4A is a graph illustrating the absorptance and transmittance spectrum of a silicon wafer to light.
Figure 4B:
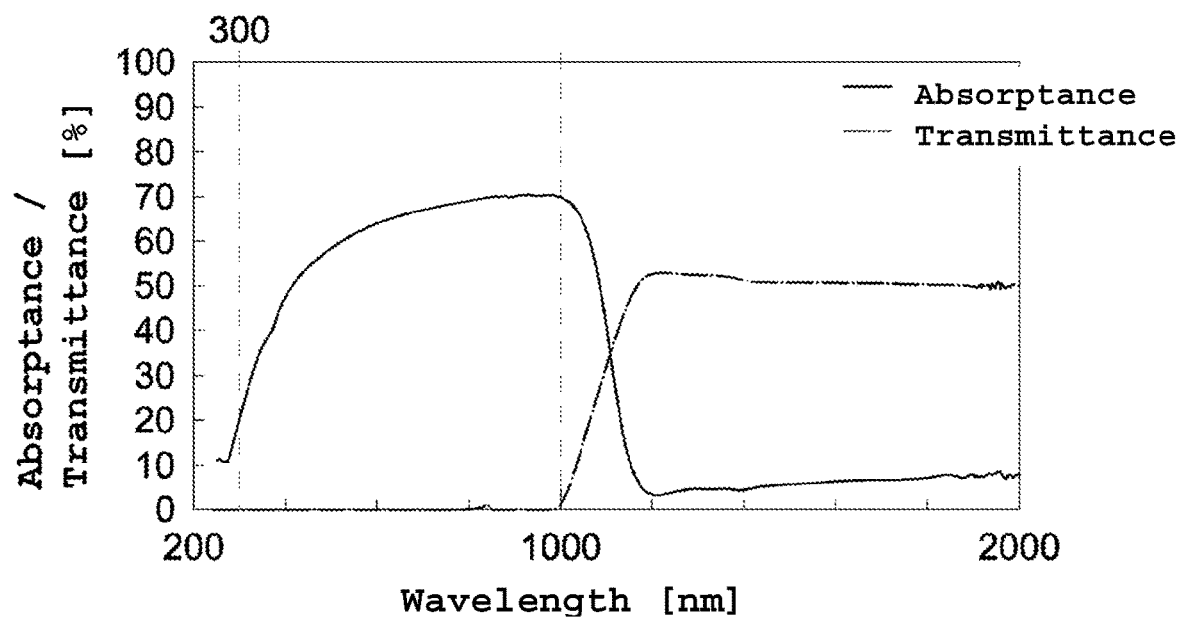
FIG. 4B is a graph illustrating the absorptance and transmittance spectrum of a silicon wafer to light.
Figure 4C:
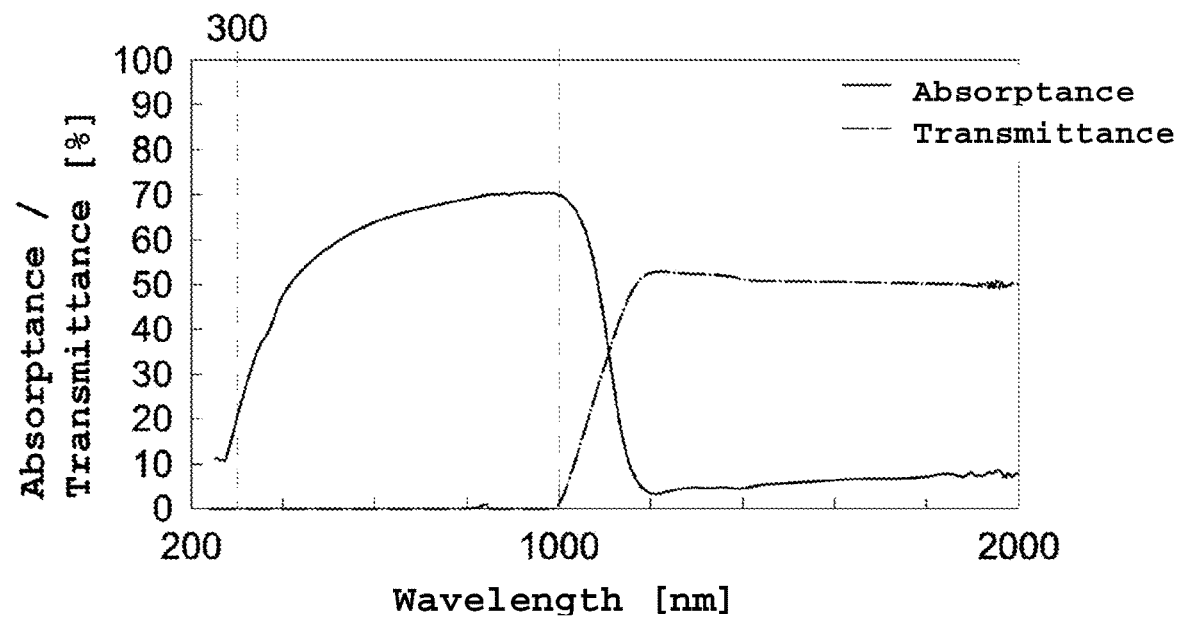
FIG. 4C is a graph illustrating the absorptance and transmittance spectrum of a silicon wafer to light.

Hereinafter, the absorption spectrum of a silicon wafer to light is explained. FIGS. 4A to 4C are graphs illustrating the absorptance and transmittance spectrum of the silicon wafer to light. FIG. 4A shows the absorptance and transmittance spectrum in the case in which the resistivity of the silicon wafer is 0.02 Ω·cm, FIG. 4B shows that in the case in which the resistivity of the silicon wafer is 3 Ω·cm, and FIG. 4C shows that in the case in which the resistivity of the silicon wafer is 11 Ω·cm.

As shown in FIGS. 4A to 4C, the absorptance and transmittance of the silicon wafer to light have nearly the same spectrum for all the resistivity values in the wavelength range of 300 nm or more and 1000 nm or less. Hence, the silicon wafer exhibits smaller variation in the transmittance and reflectance to light having a wavelength of 300 nm or more and 1000 nm or less, compared with the resistivity variation that is caused by the amount of ion doping onto the silicon wafer. For this reason, the light source unit 2 according to the first embodiment is capable of performing the heating treatment of the main surface W1b of the substrate to be treated W1 uniformly and at a constant heating rate regardless of the amount of the ion doping.

The silicon wafer, as shown in FIGS. 4A to 4C, has an absorptance of 20% or more and a transmittance of nearly 0% for light having a wavelength of 300 nm or more and 1000 nm or less. For this reason the light in this wavelength range is capable of efficiently performing heating treatment only on the outermost surface of the silicon wafer.

In the light source unit 2 of the first embodiment, the wavelength band of the light emitted from the LED elements 11 is selected to be 395 nm, this wavelength being in a wavelength range of 300 nm or more and 500 nm or less. As shown in FIG. 4A to 4C, absorptance significantly varies with respect to wavelength variation in the wavelength range of 300 nm or more and 500 nm or less. However, the light source unit 2 being composed of the LED elements 11 that emit light only having substantially the same peak wavelength suppresses uneven treatment to the silicon wafer.

Furthermore, the heating treatment device 1 of the first embodiment is configured such that the radiation thermometer 14 has a sensitivity wavelength range that is different from the wavelength range of the light emitted from the LED elements 11. This configuration reduces a risk that the radiation thermometer 14 detects the light emitted from the LED elements 11 as stray light.

In the first embodiment, the LED elements 11 are disposed on the small board 20 arranged on the board 12 to constitute a plurality of the light source areas 12a; however, the LED elements 11 may be directly disposed on the board 12 to form the light source area 12a.

Second Embodiment

The following is a description of the configuration of the second embodiment of the heating treatment device 1, focusing on the points that differ from those of the first embodiment.

The heating treatment device 1 of the second embodiment has the same configuration as that of the first embodiment shown in FIG. 1. The light source area 12a of the light source unit 2 is composed of LED elements 11 that emit light only having a peak wavelength of 850 nm.

As shown in FIGS. 4A to 4C, the silicon wafer has a small variation in absorptance with respect to wavelength variation for light having a wavelength range of 800 nm or more and 900 nm or less. Hence the above configuration is capable of heating the silicon wafer uniformly even though the peak wavelength of the light emitted from each of the LED elements 11 varies.

In the second embodiment, the radiation thermometer 14 is preferably adopted to have a sensitivity wavelength band of 1 μm or more to prevent the light emitted from the LED element from being detected as stray light. The radiation thermometer 14 may not be provided in a configuration in which the heating treatment process is determined by controlling time or the like.

Another Embodiment

Hereinafter, another embodiment is described.

Figure 5:
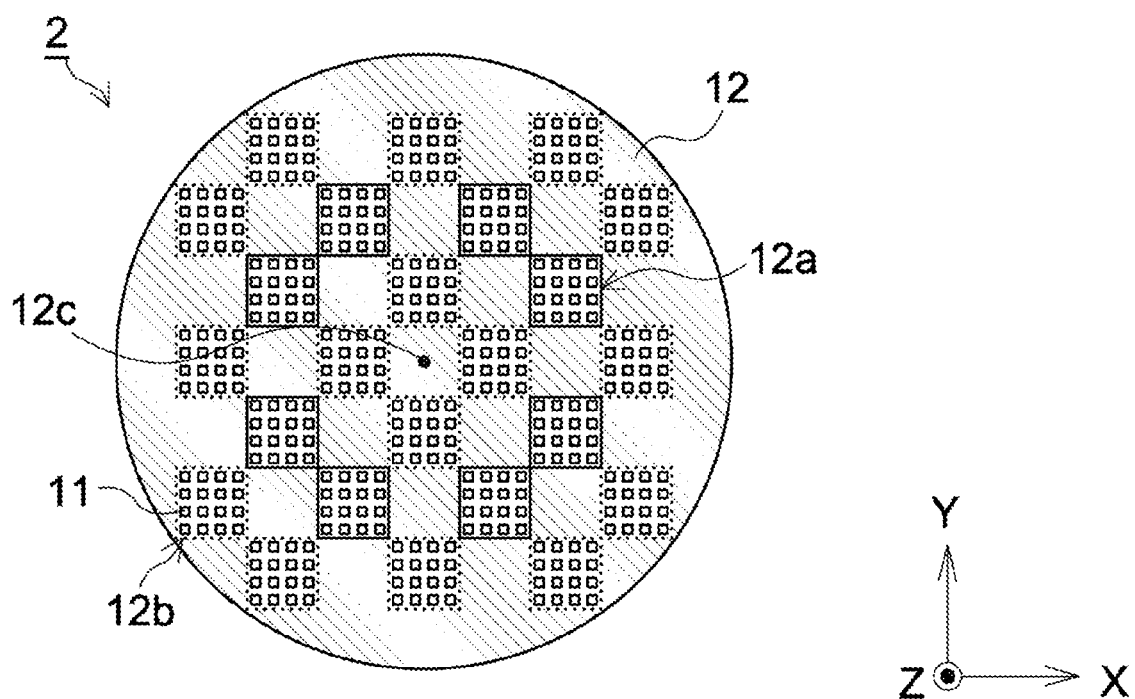
FIG. 5 is a view of another embodiment of a light source unit, viewed from +Z side.

FIG. 5 is a view of another embodiment of a light source unit 2, viewed from +Z side. In the light source unit 2 of the present embodiment shown in FIG. 5, the areas surrounded by solid lines each indicate the light source area 12a, which is a single-wavelength light source area composed of LED elements 11 having substantially the same peak wavelength. And the areas surrounded by dashed lines each indicate the light source area 12b, which is not the single-wavelength light source area.

The above configuration enhances the uniformity of light intensity distribution in the circumferential direction of the main surface W1b of the substrate to be treated W1. In particular, for the substrate to be treated W1 having a disk shape, such as semiconductor wafers, uneven irradiation in the circumferential direction is suppressed, leading to achieve more uniform heating treatment.

In the present embodiment, as shown in FIG. 5, the light source areas 12a, which are the single-wavelength areas, are arranged in the circumferential direction on the main surface of the board 12; however, the light source areas (12a, 12b) may not be arranged in the circumferential direction. In the case that, for example, the heating treatment is performed while rotating the substrate to be treated W1 or the board 12, the light source areas 12a may be provided only in a part of the board 12 instead of a circle around the center 12c.

Moreover, in the case that a plurality of the single-wavelength light source areas 12a are formed, light emitted from each of the single-wavelength light source areas 12a may have a different peak wavelength.

<2> In the embodiments described above, the light source areas (12a, 12b) each are shown as a square and the small board 20 is shown as a rectangle; however, they can be a circle or a polygon shape other than a quadrangle. The light source areas (12a, 12b) and the small board 20 may be arranged to form in a circular shape around the center 12c of the board 12, and each shape of light source areas (12a, 12b) and small board 20 may be different.

In addition, the LED element groups 11s each are composed of the same number of LED elements; however the number of LED elements included therein may be different due to the consideration of the difference in voltage drop associated with the respective distance from the anode electrode 30a and cathode electrode 30b.

<3> The configuration of the heating treatment device 1 described above is merely an example, and the present invention is not limited to each configuration shown in the figures.

What is claimed is:

1. A heating treatment device for heating a substrate to be treated, the heating treatment device comprising:
   a chamber for accommodating the substrate to be treated,
   a supporter for supporting the substrate to be treated in the chamber, and
   a light source unit further comprising:
   a board having a main surface, and
   a plurality of light source areas formed by a plurality of Light Emitting Diode (LED) elements mounted on the board, wherein
      each of the light source areas is provided with a plurality of LED element groups connected in parallel, each of the LED element groups being composed of a plurality of the LED elements connected in series,
      a first line connecting a first anode electrode with a second anode electrode and a second line connecting a first cathode electrode with a second cathode electrode, one end of each of the LED element groups being connected to the first line while the other end of each of the LED element groups being connected to the second line;
      a Zener diode connected to the first anode electrode and the first cathode electrode; and
      at least one of the light source areas is a single-wavelength light source area in which all of the LED elements emit light having substantially a same peak wavelength.

2. The heating treatment device for heating a substrate to be treated according to claim 1, wherein each of the LED element groups included in the single-wavelength light source area has a same number of the LED elements connected in series.

3. The heating treatment device for heating a substrate to be treated according to claim 1, wherein the single-wavelength light source area is arranged in a circumferential direction of the board when viewed from a direction perpendicular to the main surface of the board.

4. The heating treatment device for heating a substrate to be treated according to claim 1, wherein all of the LED elements mounted on the board emit light having substantially the same peak wavelength.

5. The heating treatment device for heating a substrate to be treated according to claim 1, wherein the LED elements included in the single-wavelength light source area emit light having a peak wavelength of 300 nm or more and 1000 nm or less.

6. The heating treatment device for heating a substrate to be treated according to claim 5, wherein the LED elements included in the single-wavelength light source area emit light having a peak wavelength of 300 nm or more and 500 nm or less.

7. The heating treatment device for heating a substrate to be treated according to claim 5, wherein the LED elements included in the single-wavelength light source area emit light having a peak wavelength of 800 nm or more and 900 nm or less.

8. A heating treatment device for heating a substrate to be treated, the heating treatment device comprising:
   a chamber for accommodating the substrate to be treated,
   a supporter for supporting the substrate to be treated in the chamber, and
   a light source unit further comprising:
   a board having a main surface, and
   a plurality of light source areas formed by a plurality of Light Emitting Diode (LED) elements mounted on the board, wherein
      each of the light source areas is provided with a plurality of LED element groups connected in parallel, each of the LED element groups being composed of a plurality of the LED elements connected in series,
      a first line connecting a first anode electrode with a second anode electrode and a second line connecting a first cathode electrode with a second cathode electrode, one end of each of the LED element groups being connected to the first line while the other end of each of the LED element groups being connected to the second line;
      a Zener diode connected to the first anode electrode and the first cathode electrode;
      at least one of the light source areas is a single-wavelength light source area in which all of the LED elements emit light having substantially a same peak wavelength; and
      a plurality of small boards disposed on the board, wherein each of the light source areas is formed on a corresponding one of the small boards that are different with each other.

9. The heating treatment device for heating a substrate to be treated according to claim 8, wherein each of the LED element groups included in the single-wavelength light source area has a same number of the LED elements connected in series.

10. The heating treatment device for heating a substrate to be treated according to claim 8, wherein the single-wavelength light source area is arranged in a circumferential direction of the board when viewed from a direction perpendicular to the main surface of the board.

11. The heating treatment device for heating a substrate to be treated according to claim 8, wherein all of the LED elements mounted on the board emit light having substantially the same peak wavelength.

12. The heating treatment device for heating a substrate to be treated according to claim 8, wherein the LED elements included in the single-wavelength light source area emit light having a peak wavelength of 300 nm or more and 1000 nm or less.

13. The heating treatment device for heating a substrate to be treated according to claim 12, wherein the LED elements included in the single-wavelength light source area emit light having a peak wavelength of 300 nm or more and 500 nm or less.

14. The heating treatment device for heating a substrate to be treated according to claim 12, wherein the LED elements included in the single-wavelength light source area emit light having a peak wavelength of 800 nm or more and 900 nm or less.

\* \* \* \* \*